(12) United States Patent
Iwase et al.

(10) Patent No.: US 12,185,472 B2
(45) Date of Patent: Dec. 31, 2024

(54) METAL PATTERN FORMING METHOD

(71) Applicant: FUJIFILM Corporation, Tokyo (JP)

(72) Inventors: Eijiro Iwase, Minamiashigara (JP); Kenji Ichikawa, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 186 days.

(21) Appl. No.: 17/951,160

(22) Filed: Sep. 23, 2022

(65) Prior Publication Data

US 2023/0028779 A1 Jan. 26, 2023

Related U.S. Application Data

(63) Continuation of application No. PCT/JP2021/010056, filed on Mar. 12, 2021.

(30) Foreign Application Priority Data

Mar. 24, 2020 (JP) ................................ 2020-052715

(51) Int. Cl.
*H05K 3/12* (2006.01)

(52) U.S. Cl.
CPC ... *H05K 3/1208* (2013.01); *H05K 2203/0143* (2013.01)

(58) Field of Classification Search
CPC ............................................ H05K 2203/0143
See application file for complete search history.

(56) References Cited

U.S. PATENT DOCUMENTS

| | | | |
|---|---|---|---|
| 5,180,639 A | 1/1993 | Zarnoch | |
| 2002/0015800 A1* | 2/2002 | Miyamoto | ............. B41M 5/529 427/299 |

(Continued)

FOREIGN PATENT DOCUMENTS

| | | |
|---|---|---|
| JP | 4-289176 A | 10/1992 |
| JP | 10-326559 A | 12/1998 |

(Continued)

OTHER PUBLICATIONS

International Preliminary Report on Patentability and English translation of the Written Opinion of the International Searching Authority (Forms PCT/IB/326, PCT/IB/373 and PCT/ISA/237) for International Application No. PCT/JP2021/010056, dated Oct. 6, 2022.

(Continued)

*Primary Examiner* — Nathan T Leong
(74) *Attorney, Agent, or Firm* — Birch, Stewart, Kolasch & Birch, LLP

(57) ABSTRACT

A metal pattern forming method has: producing a first base having a pattern of lyophilic portions which have lyophilic properties with respect to a liquid containing a metal component and liquid-repellent portions which have liquid-repellent properties with respect to the liquid containing a metal component; producing a second base which holds the liquid containing a metal component; and transferring the liquid containing a metal component from the second base to the lyophilic portions of the first base by bringing the first base and the second base into contact with each other. With the metal pattern forming method, it is possible to form a metal pattern with high accuracy in which the metal is prevented from adhering to an unnecessary position on the base.

18 Claims, 1 Drawing Sheet

(56) References Cited

U.S. PATENT DOCUMENTS

2004/0043334 A1* 3/2004 Kobayashi ........... H05K 3/1208
427/595
2017/0256332 A1 9/2017 Miyazaki et al.

FOREIGN PATENT DOCUMENTS

| JP | 2003-309344 A | | 10/2003 |
|---|---|---|---|
| JP | 2010-58330 A | | 3/2010 |
| JP | 2010058330 | * | 3/2010 |
| JP | 2013-108127 A | | 6/2013 |
| JP | 2016-139688 A | | 8/2016 |
| JP | 2016-48601 A | | 4/2018 |

OTHER PUBLICATIONS

International Search Report (Form PCT/ISA/210) for International Application No. PCT/JP2021/010056, dated May 18, 2021, with English translation.

Japanese Office Action for corresponding Japanese Application No. 2022-509925, dated Jun. 20, 2023, with English translation.

Extended European Search Report for corresponding European Application No. 21774918.3, dated Oct. 17, 2023.

Chinese Office Action and Search Report for corresponding Chinese Application No. 202180022615.2, dated Aug. 27, 2024, with an English translation.

* cited by examiner

METAL PATTERN FORMING METHOD

CROSS-REFERENCE TO RELATED APPLICATIONS

This application is a Continuation of PCT International Application No. PCT/JP2021/010056 filed on Mar. 12, 2021, which claims priority under 35 U.S.C. § 119(a) to Japanese Patent Application No. 2020-052715 filed on Mar. 24, 2020. The above application is hereby expressly incorporated by reference, in its entirety, into the present application.

BACKGROUND OF THE INVENTION

1. Field of the Invention

The present invention relates to a metal pattern forming method for forming a metal pattern to be a wiring or the like on a surface of a base.

2. Description of the Related Art

A technology for forming a desired wiring structure by using a conductive ink containing a conductive material such as a metal has been known.

As a general method, a method in which a conductive ink is applied to an optional base, and then cured using a mask having an opening pattern corresponding to a wiring to be formed, and the extra conductive ink which is in a portion other than a lyophilic portion is washed away has been known.

Regarding this, as a method capable of forming a fine metal pattern, a metal pattern forming method using a nanoimprint technology has been known.

In the formation of a metal pattern using a nanoimprint technology, for example, as described in JP2016-139688A, first, fine grooves according to a metal pattern are formed on a base (substrate) on which the metal pattern (conductive pattern) is formed. Next, a conductive ink is applied to the base having the grooves formed thereon. After that, the conductive ink is dried, and a heating treatment, sintering, and the like are optionally performed thereon to cure the ink. Then, the conductive ink which is in a portion other than the groove portion is removed, and the metal pattern is thus formed on the base.

By using the nanoimprint technology, a fine metal pattern can be formed.

On the other hand, the formation of a metal pattern using the nanoimprint technology has a problem that the higher the fineness of the metal pattern, the more difficult it is to accurately form the grooves.

There is also known a metal pattern forming method which does not provide irregularities on a base, but uses lyophilic properties and liquid-repellent properties with respect to a conductive ink.

In this method, lyophilic portions and liquid-repellent portions with respect to a conductive ink are provided in a pattern according to a metal pattern to be formed on a surface of the base. By applying a conductive ink to the base having a pattern of the lyophilic portions and the liquid-repellent portions and selectively adhering the ink to the lyophilic portions, a metal pattern is formed.

For example, JP2016-048601A describes a metal pattern forming method using lyophilic properties and liquid-repellent properties which are generated by a fluororesin.

In the method described in JP2016-048601A, first, a fluorine-containing resin layer is formed on a surface of a base, and then functional groups are formed on a metal pattern forming portion (pattern forming portion) of the fluorine-containing resin layer. Next, a conductive ink (metal microparticle dispersion) obtained by dispersing metal microparticles protected by an amine compound as a first protective material and a fatty acid as a second protective material in a solvent is applied by, for example, a blade method.

In this method, the conductive ink is repelled by liquid repelling due to the fluorine-containing resin having no functional group at a place other than the pattern forming portion. In addition, in a case where the blade method is used, the repelled conductive ink can be removed from the surface of the base. In the pattern forming portion, the metal microparticles can be fixed by being bonded to the functional groups of the pattern forming portion. According to the method described in JP2016-048601A, a desired metal pattern can thus be formed on the base.

SUMMARY OF THE INVENTION

A fine metal pattern can be formed in either the method using nanoimprinting as described in JP2016-139688A or the method using the pattern of the lyophilic portions and the liquid-repellent portions with respect to a conductive ink as described in JP2016-048601A.

Here, it is preferable that on the base with the metal pattern formed thereon, a conductive ink, that is, a conductive material such as a metal does not adhere to a portion other than the metal pattern forming portion.

However, in these metal pattern forming methods according to the related art, it is not possible to sufficiently prevent the conductive ink from adhering to a portion other than the metal pattern forming portion.

An object of the present invention is to solve such a problem of the related art, and to provide a metal pattern forming method in which in the formation of a metal pattern on a base, without being adhered to an unnecessary position on the base, a metal is selectively supplied to a position where the metal pattern is formed, and thus it is possible to form a metal pattern with high accuracy.

In order to solve the problem, the present invention has the following configuration.

[1] A metal pattern forming method having, in the formation of a metal pattern on a base by using a liquid containing a metal component:
producing a first base having lyophilic portions according to the metal pattern to be formed which have lyophilic properties with respect to the liquid containing a metal component, and liquid-repellent portions which have liquid-repellent properties with respect to the liquid containing a metal component;
producing a second base which holds the liquid containing a metal component; and
transferring the liquid containing a metal component from the second base to the lyophilic portions of the first base by bringing the first base and the second base into contact with each other.

[2] The metal pattern forming method according to [1], in which the second base has a roller shape.

[3] The metal pattern forming method according to [1] or [2], in which the second base holds the liquid containing a metal component in dots.

[4] The metal pattern forming method according to any one of [1] to [3], in which a contact angle of the liquid containing a metal component with respect to the lyophilic portion of the first base is 15° or less, and a contact angle of the liquid containing a metal component with respect to the liquid-repellent portion of the first base is 70° or greater.

[5] The metal pattern forming method according to any one of [1] to [4], in which a difference between a contact angle of the liquid containing a metal component with respect to the lyophilic portion of the first base and a contact angle of the liquid containing a metal component with respect to the liquid-repellent portion of the first base is 70° or greater.

[6] The metal pattern forming method according to any one of [1] to [5], in which a surface tension of the liquid containing a metal component at 25° C. is 22 to 35 dyn/cm.

[7] The metal pattern forming method according to any one of [1] to [6], in which the first base has a higher temperature than the second base, and the first base and the second base are brought into contact with each other.

[8] The metal pattern forming method according to any one of [1] to [7], in which the liquid containing a metal component is an aqueous solution of metal particles or a metal compound, or a dispersion liquid obtained by dispersing metal particles or a metal compound in water.

[9] The metal pattern forming method according to any one of [1] to [8], in which the second base holds the liquid containing a metal component according to the metal pattern to be formed on the first base.

[10] The metal pattern forming method according to any one of [1] to [9], in which the liquid containing a metal component, which is held by the second base, is adjusted prior to the contact between the first base and the second base.

[10] The metal pattern forming method according to [10], in which the adjustment of the liquid containing a metal component includes one or more of viscosity adjustment, surface tension adjustment, and concentration adjustment.

According to the present invention, a metal is prevented from adhering to an unnecessary position and is selectively supplied to a position where a metal pattern is formed, and thus it is possible to form a metal pattern with high accuracy.

DESCRIPTION OF THE PREFERRED EMBODIMENTS

Hereinafter, a coating method according to an embodiment of the present invention will be described in detail based on preferred examples shown in the accompanying drawings.

In the present invention, a numerical range expressed using "to" means a range including numerical values before and after "to" as a lower limit and an upper limit.

A metal pattern forming method according to the embodiment of the present invention is used to form a metal pattern on a surface of a base having lyophilic portions and liquid-repellent portions patterned according to the metal pattern to be formed by using lyophilic properties and liquid-repellent properties with respect to a liquid containing a metal component.

Here, in the metal pattern forming method according to the related art using lyophilic properties and liquid-repellent properties as described in JP2016-048601A, a conductive ink is directly applied to a base having lyophilic portions and liquid-repellent portions according to a metal pattern to be formed.

In the metal pattern forming method according to the embodiment of the present invention, a liquid containing a metal component is not applied to a base having lyophilic portions and liquid-repellent portions according to a metal pattern, but transferred to the base from another base to form the metal pattern on the base. Specifically, in the present invention, by transferring a liquid containing a metal component from a second base holding the liquid containing a metal component to a first base with a pattern of lyophilic portions and liquid-repellent portions formed thereon, a metal pattern is formed on the first base.

In the following description, the liquid containing a metal component which forms a metal pattern is also referred to as "conductive ink" for convenience.

In addition, the pattern of lyophilic portions having lyophilic properties with respect to a conductive ink and liquid-repellent portions having liquid-repellent properties with respect to a conductive ink, according to a metal pattern to be formed, is also referred to as "lyophilic-repellent pattern" for convenience.

Furthermore, in the following description, the lyophilic properties, the liquid-repellent properties, and the lyophilic-repellent pattern are lyophilic properties, liquid-repellent properties, and a lyophilic-repellent pattern with respect to a conductive ink, unless otherwise specified.

Figure 1:
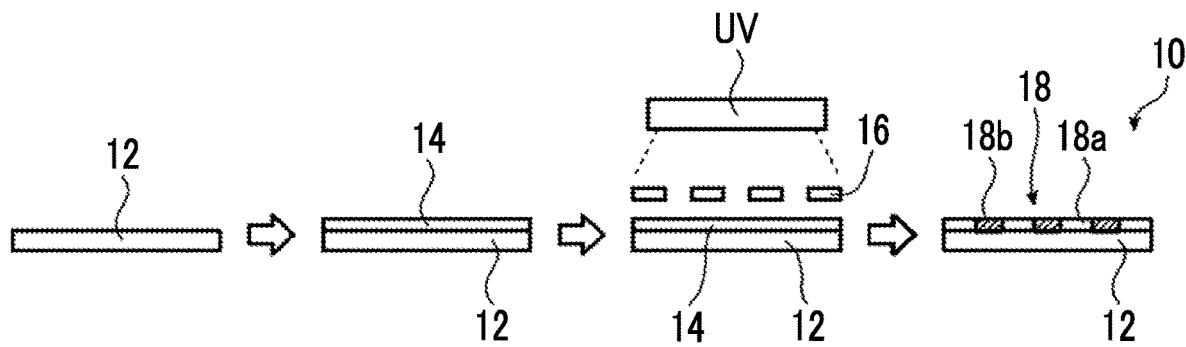
FIG. 1 is a schematic diagram for explaining the production of a first base in a metal pattern forming method according to an embodiment of the present invention.

FIG. 1 schematically shows an example of a method of forming a first base having a lyophilic-repellent pattern.

First, as shown on the left side of FIG. 1, a support 12 to be a first base, which is a base on which a metal pattern is formed, is prepared.

The support 12 is not limited, and various materials which are used as a support (base, substrate) in various devices, members, components, and the like used for wiring bases, integrated circuits, semiconductor devices, electronic devices, and the like can be used with the formation of a metal pattern.

Examples of the support 12 include sheet-like materials (plate-like material, film) such as resin films consisting of a resin such as polyethylene terephthalate (PET), polyethylene naphthalate (PEN), cycloolefin polymer (COP), polyimide, cycloolefin copolymer (COC), or triacetylcellulose (TAC), glass plates, and silicon wafers.

In addition, the support 12 may be a material obtained by forming a certain film (layer) on a surface of these sheet-like materials.

The film formed on a surface of a sheet-like material is not limited, and may be an organic substance or an inorganic substance. Examples of the film formed on a surface of a sheet-like material include a silicon oxide film, a silicon nitride film, a silicon oxynitride film, and an aluminum oxide film.

These films may have lyophilic properties or liquid-repellent properties.

The method of forming these films is not limited, and depending on the film to be formed, known methods such as vapor deposition methods such as sputtering and plasma chemical vapor deposition (CVD), application methods, and attachment of a sheet-like material may be used for formation (film formation).

The thickness of the sheet-like support 12 is not limited. That is, the thickness of the support 12 may be appropriately set depending on the use of the first base with a metal pattern formed thereon by the method according to the embodiment of the present invention.

In addition, the sheet-like support 12 may have or may not have flexibility. In the present invention, the sheet-like support 12 preferably has flexibility in consideration of easy transfer and the like.

In the metal pattern forming method according to the embodiment of the present invention, the first base with a metal pattern formed thereon is not limited to a sheet-like material, and objects having various shapes such as a sphere, a cube, a rectangular parallelepiped, a columnar body, a conical body, and an amorphous material can also be used as a base.

The first base with a metal pattern formed thereon by the present invention may be a raw material, an intermediate product, or a finished product.

As shown in the second step from the left in FIG. 1, a liquid-repellent film 14 having liquid-repellent properties with respect to a conductive ink is formed on one main surface of the support 12.

The liquid-repellent film 14 is not limited, and any film consisting of a material having liquid-repellent properties with respect to a conductive ink can be used depending on the solvent or dispersion medium of the conductive ink.

For example, in a case where the conductive ink is an aqueous solution or a dispersion liquid in which water is used as a dispersion medium, examples of the liquid-repellent film 14 include a film consisting of a fluorine-containing compound such as polytetrafluoroethylene (PTFE). A commercially available product can also be suitably used as the film consisting of a fluorine-containing compound. Examples of commercially available products of the film consisting of a fluorine-containing compound include OPTOOL (manufactured by DAIKIN INDUSTRIES, Ltd.), NOVEC (manufactured by 3M), and KBM1903 (manufactured by Shin-Etsu Chemical Co., Ltd.).

Next, as shown in the third step from the left in FIG. 1, the liquid-repellent film 14 is treated via a mask 16 having openings according to a metal pattern to be formed, whereby the treated portions are made hydrophilic. In the example shown in the drawing, for example, ultraviolet rays are applied from a light source UV via the mask 16 to make the portions irradiated with the ultraviolet rays in the liquid-repellent film 14 hydrophilic.

Accordingly, as shown on the right side of FIG. 1, a first base 10 in which a lyophilic-repellent pattern 18 having liquid-repellent portions 18a having liquid-repellent properties with respect to a conductive ink and lyophilic portions 18b (shaded portions) having lyophilic properties with respect to a conductive ink is formed according to a metal pattern to be formed is produced on the support 12.

The lyophilic treatment for the liquid-repellent film 14 is not limited, and various treatments capable of making the liquid-repellent film 14 lyophilic can be used depending on the kind of the liquid-repellent film 14.

Examples thereof include, in addition to the UV irradiation as in the example shown in the drawing, ozone irradiation, a plasma treatment, and electron beam irradiation.

In the metal pattern forming method according to the embodiment of the present invention, there are no limitations on making the liquid-repellent film 14 lyophilic through the above treatments.

For example, in a case where the support 12 has lyophilic properties, a first base 10 having a lyophilic-repellent pattern 18 may be produced by removing the liquid-repellent film 14 by UV irradiation, ozone irradiation, a plasma treatment, electron beam irradiation, etching, or the like via the mask 16 according to a metal pattern to be formed.

In a case where the support 12 has liquid-repellent properties, a first base 10 having a lyophilic-repellent pattern 18 may be produced by removing the liquid-repellent film 14 by UV irradiation or the like via the mask 16 according to a metal pattern to be formed, and by making the portions where the liquid-repellent film 14 is removed in the support 12 lyophilic.

Furthermore, in a case where the support 12 has liquid-repellent properties, a first base 10 having a lyophilic-repellent pattern 18 may be produced by removing the liquid-repellent film 14 by UV irradiation or the like via the mask 16 according to a metal pattern to be formed, and by then making the portions where the liquid-repellent film 14 is removed in the support 12 lyophilic by UV irradiation, ozone irradiation, a plasma treatment, or the like.

In the present invention, the lyophilic treatment for forming a lyophilic-repellent pattern on the liquid-repellent film 14 is not limited to the method using the mask 16.

For example, the lyophilic treatment for the liquid-repellent film 14 may be performed as described above by performing light beam scanning with laser light or the like modulated by a known modulation method such as pulse modulation, intensity modulation, or area modulation.

In the present invention, the method of producing a first base having a lyophilic-repellent pattern with respect to a conductive ink is not limited. That is, in the metal pattern forming method according to the embodiment of the present invention, as the method of producing a first base, all known methods which are used in methods of forming a metal pattern, a conductive pattern, and the like by using a lyophilic-repellent pattern can be used.

For example, in the method shown in FIG. 1, a liquid-repellent film is formed on the surface of the support 12, and a lyophilic treatment according to a metal pattern to be formed is performed to form a lyophilic-repellent pattern on the support 12. However, in the present invention, a lyophilic film having lyophilic properties may be formed on the surface of the support 12 and subjected to a liquid-repellent treatment according to a metal pattern to be formed, and a first base in which a lyophilic-repellent pattern is formed on the support 12 may thus be produced.

Alternatively, ozone irradiation, a plasma treatment, UV irradiation, electron beam irradiation, or the like may be performed on the liquid-repellent support 12 via a mask according to a metal pattern to be formed to subject the support 12 to a lyophilic treatment according to the metal pattern, and a first base in which a lyophilic-repellent pattern is formed on the support 12 may thus be produced. On the contrary, the above-described various treatments may be performed on the lyophilic support 12 via a mask according to a metal pattern to be formed to subject the support 12 to a liquid-repellent treatment, and a first base in which a lyophilic-repellent pattern is formed on the support 12 may thus be produced.

Alternatively, using a mold (transfer member, stamp) having protruding portions according to liquid-repellent portions of a lyophilic-repellent pattern, a lyophilic film may be formed on the support 12, and then a liquid-repellent material may be applied to the protruding portions of the mold and transferred to a surface of the lyophilic film to produce a first base 10 in which the lyophilic-repellent pattern is formed on the support 12. On the contrary, using a mold having protruding portions according to lyophilic portions of a lyophilic-repellent pattern, a liquid-repellent film may be formed on the support 12, and then a lyophilic material may be applied to the protruding portions of the mold and a lyophilic material may be transferred to a surface of a liquid-repellent film to produce a first base 10 in which the lyophilic-repellent pattern is formed on the support 12.

In the first base 10 with the lyophilic-repellent pattern formed thereon as above, the surface on which the lyophilic-repellent pattern is formed may be flat or may have irregularities such that the lyophilic portions 18b are recessed.

In the metal pattern forming method according to the embodiment of the present invention, the lyophilic properties, that is, the wettability of the conductive ink in the first base 10 is not limited. The contact angle of the conductive ink with respect to the liquid-repellent portion 18a may be larger than that of the conductive ink with respect to the lyophilic portion 18b.

In the first base 10, the contact angle of the conductive ink with respect to the liquid-repellent portion 18a is preferably 70° or greater.

It is preferable that the contact angle of the conductive ink with respect to the liquid-repellent portion 18a is 70° or greater since the conductive ink can be prevented from adhering to the liquid-repellent portions 18a, that is, the portion where the metal pattern is not formed on the first base 10, and the conductive ink is likely to flow into the lyophilic portions 18b.

The contact angle of the conductive ink with respect to the liquid-repellent portion 18a is more preferably 80° or greater, and even more preferably 85° or greater.

In the first base 10, the contact angle of the conductive ink with respect to the lyophilic portion 18b is preferably 15° or less.

It is preferable that the contact angle of the conductive ink with respect to the lyophilic portion 18b is 15° or less since the conductive ink can be selectively adhered to the lyophilic portions 18b, that is, the metal pattern forming portion on the first base 10, and the conductive ink is likely to spread in the lyophilic portions 18b.

The contact angle of the conductive ink with respect to the lyophilic portion 18b is more preferably 13° or less, and even more preferably 10° or less.

Basically, it is preferable that the contact angle of the conductive ink with respect to the liquid-repellent portion 18a and the contact angle of the conductive ink with respect to the lyophilic portion 18b have a large difference. Specifically, the difference between the contact angle of the conductive ink with respect to the liquid-repellent portion 18a and the contact angle of the conductive ink with respect to the lyophilic portion 18b is preferably 70° or greater.

It is preferable that the difference between the contact angle of the conductive ink with respect to the liquid-repellent portion 18a and the contact angle of the conductive ink with respect to the lyophilic portion 18b is 70° or greater since it is possible to form a metal pattern with higher accuracy by preventing the conductive ink from adhering to the liquid-repellent portions 18a and by selectively adhering the conductive ink to the lyophilic portions 18b.

The contact angle of the conductive ink in the first base 10 is a contact angle of a conductive ink 26 in a case where the conductive ink is applied to a second base 20 before adjustment of the conductive ink such as heating in the second base 20 to be described later.

Regarding this, the same is true for the physical properties of the conductive ink such as viscosity and surface tension to be described later.

Figure 2:
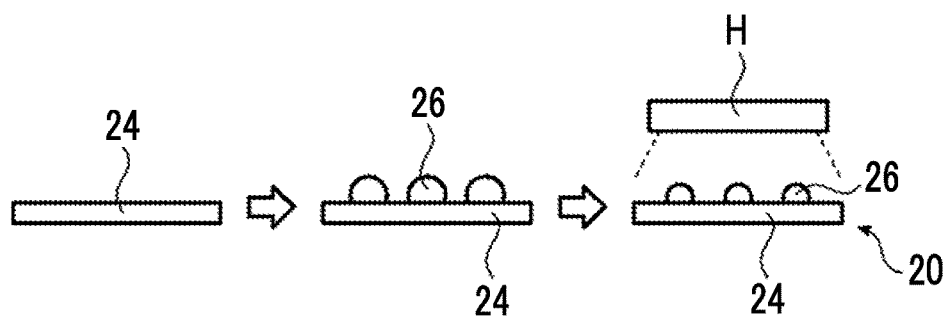
FIG. 2 is a schematic diagram for explaining the production of a second base in the metal pattern forming method according to the embodiment of the present invention.

As schematically shown in FIG. 2, a second base 20 which holds a conductive ink is produced.

First, as shown on the left side and center of FIG. 2, a conductive ink 26 is applied to one surface of a sheet-like support 24.

As the support 24 of the second base 20, various sheet-like materials exemplified in the above description of the support 12 of the first base 10 can be used.

The thickness of the support 24 is also not limited, and a thickness with which a sufficient strength, rigidity, and the like can be obtained may be appropriately set depending on the material for forming the support 24.

The support 24 may or may not have flexibility, and it is preferable that the support has flexibility in consideration of easy transfer and the like to be described later.

In the support 24 of the second base 20, the surface with the conductive ink 26 applied thereto may have liquid-repellent properties or lyophilic properties with respect to the conductive ink 26, and preferably has lyophilic properties.

Specifically, it is preferable that the surface has lyophilic properties so that the contact angle of the conductive ink 26 with respect to the surface of the support 24 with the conductive ink applied thereto is about 1° to 60°.

It is preferable that the contact angle of the conductive ink 26 with respect to the support 24 is 10 to 60° since the support 24 can properly hold the conductive ink 26, and the extra liquid can be removed from the first base 10 after transfer.

The contact angle of the conductive ink 26 with respect to the support 24 is more preferably 100 to 50°.

In the second base 20, a support 24 made of a material having lyophilic properties with respect to the conductive ink 26, or a support 24 having lyophilic properties obtained by performing a surface treatment on a support made of a material having liquid-repellent properties with respect to the conductive ink 26 may be used. As the support 24, a support obtained by performing a lyophilic treatment on a support made of a material having lyophilic properties with respect to the conductive ink 26 may also be used.

The method of improving the lyophilic degree of the support 24 is not limited, and various known methods can be used depending on the material for forming the support 24, the solvent or dispersion medium of the conductive ink, and the like.

Examples thereof include UV irradiation, ozone irradiation, a plasma treatment, and electron beam irradiation.

The conductive ink 26 is also not limited, and various conductive inks which are used for forming a metal pattern (conductive pattern, wiring pattern) on a base can be used.

Examples thereof include a conductive ink obtained by dispersing metal particles in a solvent, a conductive ink obtained by dissolving metal particles in a solvent, a conductive ink obtained by dispersing a metal compound in a solvent, and a conductive ink obtained by dispersing a metal compound in a solvent.

In the metal pattern forming method according to the embodiment of the present invention, conductive inks obtained by dispersing or dissolving various conductive materials, such as a conductive ink obtained by dispersing a conductive polymer, can also be used other than the conductive inks obtained using metal particles or a metal compound.

The solvent and the dispersion medium are not limited, and may be appropriately selected depending on the metal particles and the metal compound. The solvent and the dispersion medium are preferably water. That is, it is preferable that the conductive ink 26 is an aqueous solution or a dispersion liquid in which water is used as a dispersion medium.

The metal particles are not limited, and various conductive metal particles such as silver particles, copper particles, gold particles, and titanium particles can be used.

The particle diameter of the metal particles is not limited. The particle diameter of the metal particles is preferably 0.1 nm to 1 μm, more preferably 3 to 300 nm, and even more preferably 5 to 100 nm.

The metal compound is also not limited, and various compounds including the above-described metals can be used. In addition, the metal compound may be a complex.

As the conductive ink 26, commercially available conductive inks which are used for forming a metal pattern, a conductive pattern, a wiring pattern, and the like in the manufacturing of a transparent conductive film for a touch panel, wiring for a flexible device, an electrode, a solar cell, a radio frequency identifier (RFID), and the like can also be suitably used.

Examples thereof include conductive inks EI-1104, EI-710, and EI-1201 manufactured by Electroninks, a conductive ink SR7000 manufactured by Bando Chemical Industries, Ltd., Future Ink manufactured by Future Ink Corporation, and C-Ink manufactured by C-ink Co., Ltd.

The surface tension of the conductive ink 26 is not limited.

The surface tension of the conductive ink 26 is preferably 22 to 35 dyn/cm at 25° C. It is preferable that the surface tension of the conductive ink is 22 to 35 dyn/cm since good balance can be achieved between spreading and maintaining the shape of dots in a case where the conductive ink 26 is applied in dots to be described later, and the shape of a metal pattern can be improved.

The surface tension of the conductive ink is more preferably 22 to 32 dyn/cm, and even more preferably 23 to 30 dyn/cm at 25° C.

The viscosity of the conductive ink 26 is also not limited. The viscosity of the conductive ink 26 is preferably 1 to 100 cP.

It is preferable that the viscosity of the conductive ink 26 is 1 to 100 cP since the formation of liquid droplets in a case where the conductive ink 26 is applied to the support 24 as liquid droplets is stable, the applicability is stable, and the ink jet suitability in a case where the conductive ink 26 is applied to the support 24 in an ink jet manner is stable.

The viscosity of the conductive ink 26 is more preferably 3 to 30 cP, and even more preferably 5 to 25 cP.

The method of applying the conductive ink 26 to the support 24 is also not limited, and various known application methods can be used.

Examples thereof include an ink jet method, a curtain coater method, a roller coater method, a spray method, a bar coater method, a dispenser method, and a die coater method.

In addition, as will be described later, it is preferable that the application of the conductive ink 26 to the support 24 is performed according to a metal pattern to be formed. In consideration of this, a printing method such as ink jet printing, flexographic printing, offset printing, or gravure printing can also be suitably used for applying the conductive ink 26 to the support 24.

Here, as will be described later, it is preferable that the second base 20 holds the conductive ink 26 in dots spaced from each other.

In consideration of this, a spray method is suitably used as the method of applying the conductive ink 26 from the viewpoint that the conductive ink 26 can be applied in dots and the dot size can be easily changed. As the spray method, various known methods such as a one-fluid spray method, a two-fluid spray method, an ultrasonic spray method, a capacitance spray method, and a centrifugal spray method can be used.

In addition, an ink jet method is also suitably used as the method of applying the conductive ink 26 from the viewpoint that the conductive ink 26 can be applied to the support 24 in dots.

In the metal pattern forming method according to the embodiment of the present invention, the conductive ink 26 held by the second base 20 may be a so-called solid film having a uniform surface shape over the entire surface, and is preferably formed in dots spaced from each other as shown in the center of FIG. 2.

That is, in the present invention, it is preferable that the conductive ink 26 is applied to the support 24 of the second base 20 by using a method of performing application by allowing liquid droplets to fly as in the spray method and the ink jet method. By using the spray method, the ink jet method, or the like, the conductive ink 26 can be applied to the support 24 of the second base 20 so that the liquid droplets are formed in independent dots spaced from each other. As a result, the second base 20 can hold the dot-like conductive ink 26.

It is preferable that the conductive ink 26 held by the second base 20 is formed in dots since the conductive ink is easily transferred from the second base 20 to the first base 10, selective transfer of the conductive ink 26 to the lyophilic portions 18b is suitably performed due to a reduction in the amount of the conductive ink 26 to be transferred to the first base 10 which will be described later, and the conductive ink easily moves from the liquid-repellent portions 18a to the lyophilic portions 18b in the transfer of the conductive ink 26 to the first base 10.

The dot size of the conductive ink 26 held by the second base 20, that is, the size of the liquid droplets of the conductive ink is not limited. That is, the dot size of the conductive ink 26 held by the second base 20 may be appropriately set depending on the metal pattern to be formed.

The dot size of the conductive ink 26 held by the second base 20 is preferably 1 to 300 μm in terms of liquid droplet size before landing on the support 24 of the second base 20. The dot size mentioned here represents the longest length of the liquid droplet during flying.

It is preferable that the dot size of the conductive ink 26 is 1 to 300 μm since the above-described effect obtained by forming the conductive ink 26 in dots can be suitably obtained, the film thickness is easily made uniform, and the heating for changing the concentration of the conductive ink 26 to be described later is easily controlled.

The dot size of the conductive ink 26 is more preferably 1 to 100 μm, and even more preferably 5 to 100 μm in terms of size before landing on the support 24 of the second base 20.

The conductive ink 26 held by the second base 20 may be a uniform film over the entire surface, and is preferably formed in a pattern according to a metal pattern to be formed on the first base 10.

Therefore, the application of the conductive ink 26 to the support 24 of the second base 20 may be performed on the entire surface of the support 24, and is preferably performed according to a metal pattern to be formed on the first base 10. That is, it is preferable that the application of the conductive ink 26 to the support 24 is performed according to the pattern of the lyophilic portions 18b formed on the first base 10.

For example, in a case where a metal pattern to be formed on the first base 10 is formed in a mesh shape, it is preferable that the conductive ink 26 held by the second base 20, that is, the conductive ink 26 to be applied to the support 24 is also applied in the same mesh shape. In addition, in a case where a metal pattern to be formed on the first base 10 is formed in a stripe shape, it is preferable that the conductive ink 26 held by the second base 20, that is, the conductive ink 26 to be applied to the support 24 is also applied in the same stripe shape. Furthermore, in a case where a metal pattern to be formed on the first base 10 has a wiring pattern, it is preferable that the conductive ink 26 held by the second base 20, that is, the conductive ink 26 to be applied to the support 24 is also applied so that the same wiring pattern is formed.

Accordingly, the conductive ink can be selectively transferred to the lyophilic portions 18b of the first base 10, and the conductive ink can be prevented from adhering to the liquid-repellent portions 18a, so that it is possible to form a metal pattern with higher accuracy.

Even in a case where the application of the conductive ink 26 to the support 24 of the second base 20 is performed according to a metal pattern to be formed on the first base 10, it is preferable that the conductive ink 26 is applied to the support 24 as liquid droplets, and the conductive ink 26 held by the second base 20 is formed in dots as described above.

After the conductive ink 26 is applied to the support 24 of the second base 20, it is preferable that the conductive ink 26 on the support 24, that is, the conductive ink 26 held by the second base 20 is adjusted prior to the transfer of the conductive ink 26 to the first base 10 as shown on the right side of FIG. 2. As shown on the right side of FIG. 2, the conductive ink 26 is adjusted by heating using, for example, a heater H.

Examples of the adjustment of the conductive ink 26 include viscosity adjustment, surface tension adjustment, concentration adjustment, temperature adjustment, film thickness adjustment, and dot size adjustment in a case of dot-like conductive ink 26.

Above all, suitable examples of the adjustment of the conductive ink 26 include viscosity adjustment, surface tension adjustment, and concentration adjustment.

For example, it is preferable that the viscosity of the conductive ink 26 held by the second base 20 is increased since the conductive ink 26 can be uniformly applied without spreading unnecessarily. For example, it is preferable that the viscosity of the conductive ink 26 is reduced since, in a case where the conductive ink 26 is applied as liquid droplets, the liquid droplets are made smaller, and adjustment such as changing the transferability is easily achieved.

For example, it is preferable that the surface tension of the conductive ink 26 held by the second base 20 is reduced since the conductive ink 26 easily moves from the liquid-repellent portions 18a to the lyophilic portions 18b on the first base 10.

For example, it is preferable that the concentration of the conductive ink 26 held by the second base 20 is increased since a highly conductive metal pattern can be formed, and the thickness of the metal pattern such as wiring can be changed.

Such adjustment of the conductive ink 26 may be performed by a known method depending on the conductive ink 26 and the target to be adjusted in the conductive ink 26, that is, what target is adjusted. Specific examples of the method include heating and light irradiation such as ultraviolet irradiation.

For example, the solvent or the dispersion medium can be evaporated by heating the conductive ink 26 held by the second base 20, so that the concentration of the conductive ink 26 can be increased, the viscosity of the conductive ink 26 can be improved, and the surface tension of the conductive ink 26 can be reduced.

The method of heating the conductive ink 26 is not limited, and a known method can be used. Examples of the method of heating the conductive ink 26 include heating using the heater H as shown in FIG. 2, heating by hot air, heating by microwaves, and heating by heating the support 24.

The heating temperature of the conductive ink 26 is not limited, and may be appropriately set within a range that does not adversely affect the conductive ink 26 and the support 24, depending on the kind of the solvent or the dispersion medium used for the conductive ink 26, the material for forming the support 24, and the like. The conductive ink 26 is preferably heated so that the temperature of the conductive ink 26 is 25° C. to 100° C., more preferably 30° C. to 90° C., and even more preferably 40° C. to 80° C.

The adjustment of the conductive ink 26 before transfer in the second base 20 is required to be performed so that the conductive ink 26 after adjustment maintains fluidity as a liquid.

Figure 3:
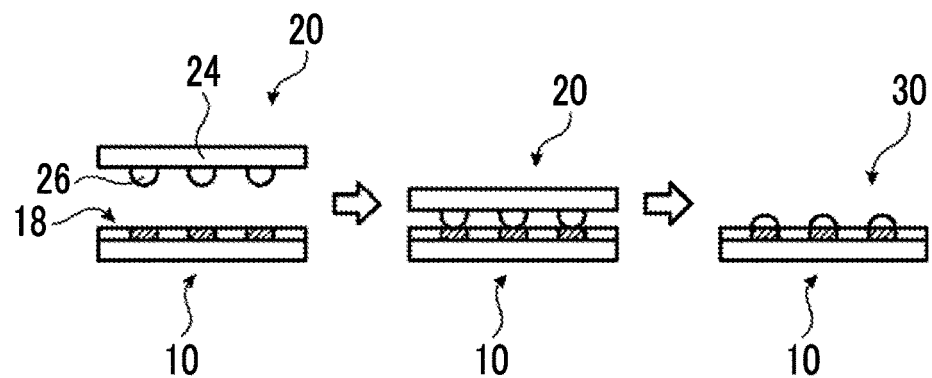
FIG. 3 is a schematic diagram for explaining the transfer in the metal pattern forming method according to the embodiment of the present invention.

After the first base 10 with the lyophilic-repellent pattern formed thereon as above and the second base 20 holding the conductive ink 26 are produced, the lyophilic-repellent pattern 18 of the first base 10 and the conductive ink 26 of the second base 20 are allowed to face each other as shown on the left side and center of FIG. 3 to bring the first base 10 and the second base 20 into contact with each other. To be precise, the lyophilic-repellent pattern 18 of the first base 10 and the conductive ink 26 of the second base 20 are brought into contact with each other.

Accordingly, the conductive ink 26 is transferred from the second base 20 to the lyophilic portions 18b of the first base 10.

In the metal pattern forming method according to the embodiment of the present invention, the conductive ink is not directly applied to the base with the lyophilic-repellent pattern formed thereon, but as described above, by transfer from the second base 20, the conductive ink 26 is supplied to the first base 10 with the lyophilic-repellent pattern 18 formed.

According to the present invention, due to such a configuration, the conductive ink 26 is prevented from adhering to the liquid-repellent portions 18a and the conductive ink 26 is selectively supplied to the lyophilic portions 18b. Thus, it is possible to form a metal pattern with high accuracy.

It has been known that the conductive ink is applied only to the liquid-repellent portions of the base by using the lyophilic-repellent pattern to form a metal pattern such as a wiring pattern. However, in the metal pattern forming method using the lyophilic-repellent pattern according to the related art, the conductive ink adhering to the liquid-repellent portions may remain, and the metal may adhere to an unnecessary portion on the base.

Regarding this, the inventors have conducted intensive studies, and as a result, found that in a case where the extra conductive ink is present in the application of the conductive ink to the base, the conductive ink does not easily adhere to the lyophilic portions of the lyophilic-repellent pattern, and is likely to remain on the liquid-repellent portions.

For example, in a case where the conductive ink is applied by a blade method, the unnecessary conductive ink repelled on the liquid-repellent portions is removed by a blade as described in JP2016-048601A. Therefore, the blade method is considered to be an application method in which the conductive ink is unlikely to remain on the liquid-repellent portions.

Here, in a case where the conductive ink is thinly applied to the base using the blade method, the conductive ink is torn off from the meniscus formed in the blade and passes through the lyophilic portions while forming small liquid droplets. The conductive ink is supplied to flow from the liquid droplets to the lyophilic portions.

Therefore, in a case where the amount of the conductive ink applied is large and the surface tension of the liquid is high, the size of the liquid droplets in a case where the liquid is first torn off from the meniscus is large, and the surface tension of the liquid exceeds a force of the liquid spreading to the lyophilic portions. Whereby, the conductive ink does not flow to the lyophilic portions.

This phenomenon is prominent as the pattern of the lyophilic portions is finer, that is, as the metal pattern to be formed is finer.

That is, according to the study by the inventors, in order to prevent the conductive ink from adhering to the liquid-repellent portions and to apply the conductive ink to the lyophilic portions on the base on which the lyophilic-repellent pattern is formed, the coating film thickness is required to be extremely small. In addition, it is necessary to use a conductive ink having a low surface tension.

However, there are also restrictions on the material of the conductive ink. For example, water is suitably used as the solvent or dispersion medium of the conductive ink, but in a case of a conductive ink obtained using water, there is a limit to the surface tension that can be lowered.

In addition, even in a case where the conductive ink can be applied neatly, the resistance does not decrease in a case where the metal density in the conductive ink is low. In other words, since it is required to supply a liquid having a certain or higher concentration of solid contents, there is also a limit to the adjustment of physical properties.

That is, the inventors have found that it is also important to take measures on the conductive ink supply side.

The present invention has been achieved by obtaining such knowledge, and by using the second base 20 holding the conductive ink 26, the conductive ink 26 is transferred from the second base 20 to the first base 10 with the lyophilic-repellent pattern 18 having the liquid-repellent portions 18a and the lyophilic portions 18b formed thereon.

In the present invention, the conductive ink 26 is held by the second base 20. In a case where such a conductive ink 26 is brought into contact with the liquid-repellent portions 18a of the first base 10, the conductive ink 26 is repelled by the liquid-repellent properties of the liquid-repellent portions 18a and remains on the second base 20.

In contrast, even in a case where the conductive ink 26 is held by the second base 20, the conductive ink 26 brought into contact with the lyophilic portions 18b is transferred from the second base 20 to the lyophilic portions 18b due to the lyophilic properties, that is, the wettability of the lyophilic portions 18b. In addition, the conductive ink 26 of the second base 20 brought into contact with and repelled by the liquid-repellent portions 18a is also moved from the liquid-repellent portions 18a to the lyophilic portions 18b due to the surface tension of the conductive ink 26.

Moreover, since the conductive ink is transferred from the second base 20, the amount of the conductive ink 26 to be supplied to the first base 10 can be reduced as compared with a case where the conductive ink is applied to the first base 10.

In addition, the conductive ink 26 is held by the second base 20 having no lyophilic-repellent pattern. Therefore, according to the present invention, various treatments such as heating and light irradiation can be performed on the conductive ink 26 with an extremely high degree of freedom.

Therefore, as shown on the right side of FIG. 2, for example, heating is preferably performed to carry out treatments such as increasing the concentration and adjusting the viscosity of the conductive ink 26 (adjusting the surface tension) prior to the transfer to the first base 10, and thus the state of the conductive ink 26 can be adjusted to a state suitable for the transfer to the first base 10 and the formation of a metal pattern.

In addition, since the conductive ink 26 can be adjusted on the second base 20, there is no influence on the application unit which applies the conductive ink 26 to the second base 20, such as nozzle clogging due to the high concentration and deterioration in applicability due to the high viscosity.

That is, according to the metal pattern forming method according to the embodiment of the present invention using transfer from the second base 20, the conductive ink 26 can be prevented from adhering to the liquid-repellent portions 18a, and can be selectively supplied and adhered to the lyophilic portions 18b.

As a result, according to the metal pattern forming method according to the embodiment of the present invention, a metal is prevented from adhering to an unnecessary portion on the base and is selectively supplied to a portion where a metal pattern is formed, and thus it is possible to form a metal pattern with high accuracy on the base even in a case where the metal pattern is a fine pattern.

In the metal pattern forming method according to the embodiment of the present invention, basically, the contact between the first base 10 and the second base 20 may be made merely by allowing the lyophilic-repellent pattern 18 of the first base 10 and the conductive ink 26 of the second base 20 to face each other and laminating the first base 10 and the second base 20. In a case where the conductive ink 26 held by the second base 20 corresponds to the lyophilic-repellent pattern 18, the first base 10 and the second base 20 are aligned and laminated.

Here, strictly, the contact between the first base 10 and the second base 20 is the contact between the lyophilic-repellent pattern 18 of the first base 10 and the conductive ink 26 held by the second base 20. Therefore, in a case where the first base 10 and the second base 20 are laminated, the interval between the support 12 of the first base 10 and the support 24 of the second base 20 may be optionally adjusted using a known spacer. The interval between the support 12 and the support 24 may be adjusted by appropriately setting the interval in which the conductive ink 26 does not unnecessarily spread by pressing in accordance with the film thickness of the conductive ink 26 held by the second base or the height of the dots.

In addition, in a case where the first base 10 and the second base 20 are brought into contact with each other, it is preferable that the temperature of the first base 10 is made higher than that of the second base 20.

This is preferable since it is possible to prevent the excessive heating in the second base 20, the heating efficiency of the conductive ink 26 can be improved, and the conductive ink 26 can be rapidly dried.

After the conductive ink 26 is transferred from the second base 20 to the first base 10 as above, the second base 20 is removed as shown on the right side of FIG. 3.

Then, the conductive ink 26 is dried to produce the first base 10 with a metal pattern 30 formed thereon. The drying may be performed by a known method such as drying by heating depending on the conductive ink 26.

After drying of the conductive ink 26, the first base 10 may be optionally washed. The washing may also be performed by a known method such as washing by the solvent or dispersion medium of the conductive ink 26.

Furthermore, after drying of the conductive ink 26, a treatment such as a heating treatment, sintering, and curing by ultraviolet irradiation is optionally performed to prepare the first base 10 with the metal pattern 30 formed thereon. The washing of the first base 10 may be performed thereafter.

In the metal pattern forming method according to the embodiment of the present invention shown in FIGS. 1 to 3, the conductive ink 26 is transferred to the first base 10 by using the sheet-like second base 20. However, the present invention is not limited thereto, and second bases of various shapes can be used.

Figure 4:
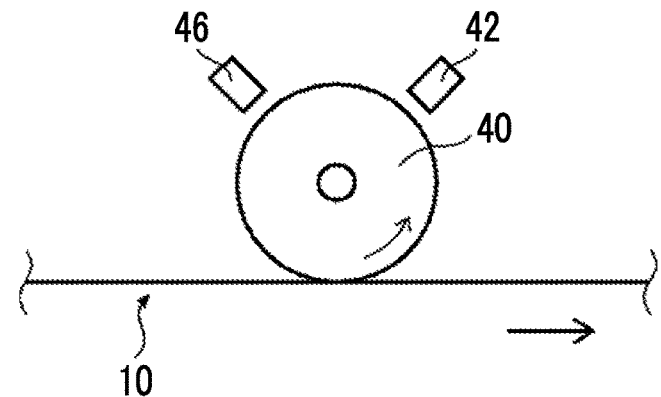
FIG. 4 is a schematic diagram showing another example of the metal pattern forming method according to the embodiment of the present invention.

Examples thereof include a roller-like second base 40 schematically shown in FIG. 4.

In the example shown in FIG. 4, an application unit 42 which applies a conductive ink to a second base 40, and a treatment unit 46 which performs the adjustment of a state of the conductive ink held by the second base 40, such as concentration by heating, are provided around the second base 40.

In the example shown in the drawing, an elongated first base 10 is brought into contact with the second base 40 in synchronization with the rotation speed (circumferential speed) of the second base 40 and is transported in a longitudinal direction.

The application unit 42 applies a conductive ink to the rotating second base 40, and the treatment unit 46 performs a treatment such as concentration on the conductive ink.

Accordingly, while the elongated first base 10 is transported in the longitudinal direction, the conductive ink can be continuously transferred by the second base 40 which is brought into contact with the first base.

Therefore, by using the roller-like second base 40, the conductive ink can be continuously applied to the first base 10 in a so-called roll-to-roll manner, and thus it is possible to form a metal pattern and to obtain high productivity.

In this case, the transportation speed of the first base 10 is not limited, and may be appropriately set depending on the metal pattern to be formed, the lyophilic-repellent pattern 18 of the first base 10, the kind of the conductive ink, and the like.

In consideration of the transfer of a suitable conductive ink to the first base 10, productivity, and the like, the transportation speed (circumferential speed) of the second base 40 is preferably 0.1 to 100 m/min, more preferably 0.5 to 20 m/min, and even more preferably 1 to 10 m/min.

Even in an aspect in which the roller-like second base 40 is used, the first base 10 is not limited to the elongated base.

A cut sheet-like first base 10 may be used, and for example, the conductive ink may be transferred to a plurality of the first bases 10.

Although the metal pattern forming method according to the embodiment of the present invention has been described above in detail, the present invention is not limited to the above aspects, and various improvements and modifications may be made without departing from the gist of the present invention.

EXAMPLES

Hereinafter, the present invention will be described in detail with reference to examples. The present invention is not limited to the following specific examples.

Example 1

<Production of First Base>

A 100 µm-thick PET film (A4100, manufactured by Toyobo Co., Ltd.) was cut into a 10×10 cm piece. A silicon nitride film was formed on a surface of the PET film having no undercoat layer by a general plasma CVD device to prepare a support of a first base.

OPTOOL manufactured by DAIKIN INDUSTRIES, Ltd. was applied to a surface of the silicon nitride film of the support by spin coating so that a thickness thereof was 5 nm. The coating film was heated for 3 minutes in an oven at 120° C. to form a liquid-repellent film. The contact angle of pure water with respect to the formed liquid-repellent film was 110°.

In addition, with respect to the formed liquid-repellent film, the contact angle of a conductive ink (conductive ink EI-1104, manufactured by Electroninks) to be applied to a second base to be described later was measured by a general contact angle meter. As a result, the contact angle of the conductive ink with respect to the liquid-repellent film was 67°. All the contact angle measurement operations were performed in the same manner.

A metal mask in which 50 slit-like openings having a width of 10 µm were formed at intervals of 200 µm in a direction orthogonal to a longitudinal direction of the openings was prepared. The interval between the openings is a distance between the centers in the arrangement direction.

By superposing a metal mask on the liquid-repellent film and applying vacuum ultraviolet rays for 5 minutes from above, the surface layer of the silicon nitride exposed was substituted with silicon hydroxide and hydrophilized while the liquid-repellent film at opening portions of the mask was removed.

Accordingly, a first base having a lyophilic-repellent pattern in which elongated lyophilic portions having a width of 10 µm were arranged at intervals of 200 µm, and liquid-repellent portions were provided between the lyophilic portions was produced.

The contact angle of the conductive ink with respect to the lyophilic portion was 12°. The lyophilic-repellent pattern is fine, and it is difficult to directly measure the contact angle in the first base. Therefore, a sample for measuring a contact angle in which a lyophilic portion was formed by applying vacuum ultraviolet rays to a liquid-repellent film produced in the same manner under the same conditions with no use of a mask was produced, and the contact angle measured with this sample was defined as a contact angle of the conductive ink with respect to the lyophilic portion of the first base.

<Production of Second Base>

A 100 μm-thick PET film (A4100, manufactured by Toyobo Co., Ltd.) was cut into a 10×10 cm piece.

A surface of the PET film having no undercoat layer was hydrophilized by being subjected to an atmospheric-pressure plasma treatment using a commercially available atmospheric-pressure plasma treatment device to prepare a support of a second base.

A conductive ink (EI-1104, manufactured by Electroninks, viscosity: 10 cP) was applied to the atmospheric-pressure plasma-treated surface of the support.

The conductive ink was applied by using an ultrasonic spray (Accumist, manufactured by SONO-TEK Corporation) and landed at a frequency controlled to 120 KHz so that the size of the flying liquid droplets was about 15 μm. Furthermore, the conductive ink was applied in dots while a head of the ultrasonic spray was moved on the support by adjusting the speed so that the covering ratio of the liquid droplets on the support was about 50%.

The contact angle of the conductive ink with respect to the support was 15°.

The support with the conductive ink applied thereto was put in an oven at 50° C. for 30 seconds to concentrate the conductive ink, and thus a second base was produced.

<Transfer Step>

The conductive ink was transferred to the first base by allowing the lyophilic-repellent pattern of the first base and the conductive ink of the second base to face each other and superimposing the second base on the first base.

In this case, the interval between the bases was controlled so that a gap between the supports of the first base and the second base was 1 to 500 μm. Specifically, a spacer made of a 10 μm PET film was sandwiched between both ends to adjust the clearance.

The first base with the conductive ink transferred thereto was heated in an oven at 120° C. for 3 minutes to dry the conductive ink, and thus a metal pattern was formed.

<Evaluation>

The produced metal pattern was observed using an optical microscope to evaluate the connectivity of the metal pattern and the adhesion of the metal to the portion where no metal pattern was formed (liquid-repellent portion).

The evaluation was performed as follows.

A: All the metal patterns are connected, and the adhesion of the metal to the portion where no pattern is formed is not recognized at all.

B: All the metal patterns are connected, but slight disturbance is shown in the metal pattern.

C: All the metal patterns are connected, but extremely slight adhesion of the metal to the portion where no pattern is formed is recognized.

D: All the metal patterns are connected, but the adhesion of the metal only to a part of the portion where no pattern is formed is recognized.

E: Some metal patterns have a portion which may not be connected, and the adhesion of the metal to the portion where no pattern is formed is clearly shown.

F: There are metal patterns which cannot be clearly connected, and the adhesion of the metal to the portion where no pattern is formed is clearly shown.

In a case where the result is one of A to D in the evaluation, it can be said that it was possible to obtain a metal pattern with high accuracy.

Example 1 was evaluated as B.

Example 2

A second base was produced in the same manner as in Example 1, except that in the production of the second base, the conductive ink was applied by a bar coater (bar=6-th), and thus the conductive ink was not applied in dots, but applied as a conductive ink film having a uniform thickness of 10 μm on the entire surface.

A metal pattern was formed in the same manner as in Example 1, except that the above second base was used.

Evaluation was performed in the same manner as in Example 1, and the result was C in the evaluation.

Example 3

A second base was produced in the same manner as in Example 1, except that in the production of the second base, the conductive ink to be used was changed to a conductive ink EI-710 (viscosity: 8 cP) manufactured by Electroninks.

The viscosity of the conductive ink EI-710 was almost the same as that of EI-1104 used in Example 1, but the contact angle of EI-710 with respect to the lyophilic portion of the first base was 240 (the surface tension of EI-710 was higher than that of EI-1104). The contact angle of the conductive ink with respect to the liquid-repellent portion was 58.7°.

A metal pattern was formed in the same manner as in Example 1, except that the above second base was used.

Evaluation was performed in the same manner as in Example 1, and the result was C in the evaluation.

Example 4

A second base was produced in the same manner as in Example 1, except that in the production of the second base, the conductive ink to be used was changed to a conductive ink EI-1201 (viscosity: 17 cP) manufactured by Electroninks.

The contact angle of the conductive ink with respect to the lyophilic portion of the first base is 20°, and the surface tension of EI-1201 is at the level intermediate between EI-1104 used in Example 1 and EI-710 used in Example 3 (EI-1201 has the highest viscosity among the three kinds of the conductive inks). The contact angle of the conductive ink with respect to the liquid-repellent portion was 63°.

A metal pattern was formed in the same manner as in Example 1, except that the above second base was used.

Evaluation was performed in the same manner as in Example 1, and the result was B in the evaluation.

Example 5

A second base was produced in the same manner as in Example 1, except that in the preparation of the second base, the conductive ink to be used was changed to a conductive ink SR7000 (viscosity: 10 cP) manufactured by BANDO CHEMICAL INDUSTRIES, LTD.

The contact angle of the conductive ink with respect to the lyophilic portion of the first base is 2°, and the lyophilic properties of SR7000 are higher than those of the conductive inks used in Examples 1, 3, and 4. The contact angle of the conductive ink with respect to the liquid-repellent portion was 59°.

A metal pattern was formed in the same manner as in Example 1, except that the above second base was used.

Evaluation was performed in the same manner as in Example 1, and the result was A in the evaluation.

Example 6

In the production of a second base, the same silicon nitride film and the same liquid-repellent film as those of the first base of Example 1 were formed on a PET film, and the resulting material was used as a support. A second base was prepared in the same manner as in Example 1, except that the above support was used.

The contact angle of the conductive ink (EI-1104) with respect to the support (liquid-repellent film) was 67°.

A metal pattern was formed in the same manner as in Example 1, except that the above second base was used.

Evaluation was performed in the same manner as in Example 1, and the result was C in the evaluation.

Example 7

In the production of a second base, the same silicon nitride film and the same liquid-repellent film as those of the first base of Example 1 were formed on a PET film. Furthermore, vacuum ultraviolet rays were applied in the same manner as in Example 1, except that the mask was not used, and thus a support was produced. A second base was prepared in the same manner as in Example 1, except that the above support was used.

The contact angle of the conductive ink (EI-1104) with respect to the support was 12°.

A metal pattern was formed in the same manner as in Example 1, except that the above second base was used.

Evaluation was performed in the same manner as in Example 1, and the result was A in the evaluation.

Example 8

A first base was produced in the same manner as in Example 1, except that in the production of the first base, KY-1903, manufactured by Shin-Etsu Chemical Co., Ltd., was used as a material for forming the liquid-repellent film. The contact angle of pure water with respect to the liquid-repellent film was 80°.

The contact angles of the conductive ink with respect to the liquid-repellent portion and the lyophilic portion of the lyophilic-repellent pattern of the first base were measured in the same manner as in Example 1. The contact angle of the conductive ink with respect to the liquid-repellent portion was 80°, and the contact angle of the conductive ink with respect to the lyophilic portion was 12°.

A metal pattern was formed in the same manner as in Example 1, except that the above first base was used.

Evaluation was performed in the same manner as in Example 1, and the result was A in the evaluation.

Example 9

In the preparation of a first base, a support was produced in the same manner as in Example 1. Then, the support was subjected to a lyophilic treatment by performing an atmospheric-pressure plasma treatment on a surface of the silicon nitride film. The contact angle of the conductive ink (EI-1104) with respect to the surface of the support subjected to the lyophilic treatment was 2°.

A mold in which 50 elongated recessed portions having a width of 10 µm were formed at intervals of 200 µm in a direction orthogonal to a longitudinal direction of the recessed portions was prepared. The interval between the recessed portions is a distance between the centers in the arrangement direction.

OPTOOL manufactured by DAIKIN INDUSTRIES, Ltd. was applied to the protruding portions of the mold, transferred to the support, and heated in an oven at 120° C. for 3 minutes. Accordingly, a first base having the same lyophilic-repellent pattern as that in Example 1, except that the contact angle with respect to the lyophilic portion was small and the lyophilic properties of the lyophilic portions were high, was produced.

A metal pattern was formed in the same manner as in Example 1, except that the above first base was used.

Evaluation was performed in the same manner as in Example 1, and the result was A in the evaluation.

Example 10

A first base was produced in the same manner as in Example 1, except that in the preparation of the first base, the mask to be used in the application of vacuum ultraviolet rays was changed to a mask in which slit-like openings having a width of 5 µm were formed at intervals of 30 µm.

A metal pattern was formed in the same manner as in Example 1, except that the above first base was used.

Evaluation was performed in the same manner as in Example 1, and the result was B in the evaluation.

Example 11

A first base was produced in the same manner as in Example 1, except that in the preparation of the first base, the mask to be used in the application of vacuum ultraviolet rays was changed to a mask in which slit-like openings having a width of 5 µm were formed at intervals of 30 µm.

In addition, the same second base as that in Example 2 was produced.

A metal pattern was formed in the same manner as in Example 1, except that the above first and second bases were used.

Evaluation was performed in the same manner as in Example 1, and the result was D in the evaluation.

Example 12

A first base was produced in the same manner as in Example 1, except that in the preparation of the first base, the mask to be used in the application of vacuum ultraviolet rays was changed to a mask in which slit-like openings having a width of 30 µm were formed at intervals of 500 µm.

A metal pattern was formed in the same manner as in Example 1, except that the above first base was used.

Evaluation was performed in the same manner as in Example 1, and the result was A in the evaluation.

Example 13

A first base was produced in the same manner as in Example 1, except that in the preparation of the first base, the mask to be used in the application of vacuum ultraviolet rays was changed to a mask in which slit-like openings having a width of 30 µm were formed at intervals of 500 µm.

In addition, the same second base as that in Example 2 was produced.

A metal pattern was formed in the same manner as in Example 1, except that the above first and second bases were used.

Evaluation was performed in the same manner as in Example 1, and the result was C in the evaluation.

Example 14

A second base was produced in the same manner as in Example 1, except that in the preparation of the second base, the final concentration of the conductive ink was changed to the concentration in an oven at 25° C. for 30 seconds.

A metal pattern was formed in the same manner as in Example 1, except that the above second base was used.

Evaluation was performed in the same manner as in Example 1, and the result was C in the evaluation.

Example 15

A second base was produced in the same manner as in Example 1, except that in the preparation of the second base, the final concentration of the conductive ink was changed to the concentration in an oven at 80° C. for 30 seconds.

A metal pattern was formed in the same manner as in Example 1, except that the above second base was used.

Evaluation was performed in the same manner as in Example 1, and the result was C in the evaluation.

Comparative Example 1

As a base on which a metal pattern was formed, the same base as the first base in Example 1 was prepared.

The same conductive ink as that in Example 1 was added dropwise to the surface of the base with the lyophilic-repellent pattern formed thereon, and the conductive ink was applied to the entire surface by a blade method.

The base was heated in an oven at 120° C. for 3 minutes in the same manner as in Example 1 to dry the conductive ink, and thus a metal pattern was formed.

Evaluation was performed in the same manner as in Example 1, and the result was F in the evaluation.

Comparative Example 2

As a base on which a metal pattern was formed, the same base as the first base in Example 1 was prepared.

The same conductive ink as that in Example 1 was applied by spraying to the surface of the base with the lyophilic-repellent pattern formed thereon in the same manner as in the case of the second base of Example 1.

The base was heated in an oven at 120° C. for 3 minutes in the same manner as in Example 1 to dry the conductive ink, and thus a metal pattern was formed.

Evaluation was performed in the same manner as in Example 1, and the result was E in the evaluation.

The results are summarized in the following table.

TABLE 1

| | First Base | | | | Second Base | | | | | |
|---|---|---|---|---|---|---|---|---|---|---|
| | Contact Angle | | Liquid-Repellent Pattern | | Conductive Ink | | Support Contact | Conductive Ink Concentration | | |
| | Lyophilic Portion | Liquid-Repellent Portion | Width | Interval | Viscosity | Pattern | Angle | Temperature | Time | Evaluation |
| Example 1 | 12° | 67° | 10 μm | 200 μm | 10 cP | dot | 15° | 50° C. | 30 seconds | B |
| Example 2 | 12° | 67° | 10 μm | 200 μm | 10 cP | uniform over the entire surface | 15° | 50° C. | 30 seconds | C |
| Example 3 | 24° | 58.7° | 10 μm | 200 μm | 8 cP | dot | 15° | 50° C. | 30 seconds | C |
| Example 4 | 20° | 63° | 10 μm | 200 μm | 17 cP | dot | 15° | 50° C. | 30 seconds | B |
| Example 5 | 3° | 59° | 10 μm | 200 μm | 10 cP | dot | 15° | 50° C. | 30 seconds | A |
| Example 6 | 12° | 67° | 10 μm | 200 μm | 10 cP | dot | 67° | 50° C. | 30 seconds | C |
| Example 7 | 12° | 67° | 10 μm | 200 μm | 10 cP | dot | 12° | 50° C. | 30 seconds | A |
| Example 8 | 12° | 80° | 10 μm | 200 μm | 10 cP | dot | 15° | 50° C. | 30 seconds | A |
| Example 9 | 2° | 67° | 10 μm | 200 μm | 10 cP | dot | 15° | 50° C. | 30 seconds | A |
| Example 10 | 12° | 67° | 5 μm | 30 μm | 10 cP | dot | 15° | 50° C. | 30 seconds | B |
| Example 11 | 12° | 67° | 5 μm | 30 μm | 10 cP | uniform over the entire surface | 15° | 50° C. | 30 seconds | D |
| Example 12 | 12° | 67° | 30 μm | 500 μm | 10 cP | dot | 15° | 50° C. | 30 seconds | A |
| Example 13 | 12° | 67° | 30 μm | 500 μm | 10 cP | uniform over the entire surface | 15° | 50° C. | 30 seconds | C |
| Example 14 | 12° | 67° | 30 μm | 500 μm | 10 cP | dot | 15° | 25° C. | 30 seconds | C |
| Example 15 | 12° | 67° | 30 μm | 500 μm | 10 cP | dot | 15° | 80° C. | 30 seconds | C |
| Comparative Example 1 | 12° | 67° | 10 μm | 200 μm | Apply the conductive ink to the same base as the first base by a blade method. | | | | | F |
| Comparative Example 2 | 12° | 67° | 10 μm | 200 μm | Apply the conductive ink to the same base as the first base by spraying. | | | | | E |

In this table, the contact angle is a contact angle of the conductive ink.

As shown in the above table, according to the present invention in which a conductive ink is applied to the second base and transferred to the first base so that a metal pattern is formed on the first base, a metal pattern with high accuracy can be formed as compared with the comparative examples in which a conductive ink is directly applied to the base with the lyophilic-repellent pattern formed thereon in the same manner as in the case of the first base so that a metal pattern is formed.

In addition, as shown in Examples 1, 2, and 10 to 13, by forming the conductive ink held by the second base in dots instead of a uniform film, a metal pattern with higher accuracy can be formed.

As shown in Examples 3 to 5, by increasing the lyophilic properties of the lyophilic portions in the lyophilic-repellent pattern of the first base, a metal pattern with higher accuracy can be formed.

As shown in Examples 6 and 7, by increasing the lyophilic properties of the support of the second base, a metal pattern with higher accuracy can be formed.

As shown in Examples 8 and 9, by increasing the liquid-repellent properties of the liquid-repellent portions in the lyophilic-repellent pattern of the first base, and by increasing the lyophilic properties of the lyophilic portions, a metal pattern with higher accuracy can be formed.

Furthermore, as shown in Example 1, 14, and 15, by heating the conductive ink at an appropriate temperature in the second base, a metal pattern with higher accuracy can be formed.

From the above results, the present invention shows definite effects.

The present invention can be suitably used for forming wiring patterns in various devices.

EXPLANATION OF REFERENCES

10: first base
12, 24: support
14: liquid-repellent film
16: mask
18: lyophilic-repellent pattern
18a: liquid-repellent portion
18b: lyophilic portion
20, 40: second base
26: conductive ink
30: metal pattern
42: application unit
46: treatment unit
UV: light source
H: heater

What is claimed is:

1. A metal pattern forming method comprising, in the formation of a metal pattern on a base by using a liquid containing a metal component:
    producing a first base having lyophilic portions according to the metal pattern to be formed which have lyophilic properties with respect to the liquid containing the metal component, and liquid-repellent portions which have liquid-repellent properties with respect to the liquid containing the metal component;
    producing a second base which holds the liquid containing the metal component; and
    transferring the liquid containing the metal component from the second base to the lyophilic portions of the first base by bringing the first base and the second base into contact with each other,
    wherein the second base holds the liquid in dots, the liquid containing the metal component.

2. The metal pattern forming method according to claim 1,
    wherein the second base has a roller shape.

3. The metal pattern forming method according to claim 2,
    wherein a contact angle of the liquid containing a metal component with respect to the lyophilic portion of the first base is 15° or less, and
    a contact angle of the liquid containing a metal component with respect to the liquid-repellent portion of the first base is 70° or greater.

4. The metal pattern forming method according to claim 2,
    wherein a difference between a contact angle of the liquid containing a metal component with respect to the lyophilic portion of the first base and a contact angle of the liquid containing a metal component with respect to the liquid-repellent portion of the first base is 70° or greater.

5. The metal pattern forming method according to claim 2,
    wherein a surface tension of the liquid containing a metal component at 25° C. is 22 to 35 dyn/cm.

6. The metal pattern forming method according to claim 2,
    wherein the first base has a higher temperature than the second base, and the first base and the second base are brought into contact with each other.

7. The metal pattern forming method according to claim 2,
    wherein the liquid containing a metal component is an aqueous solution of metal particles or a metal compound, or a dispersion liquid obtained by dispersing metal particles or a metal compound in water.

8. The metal pattern forming method according to claim 2,
    wherein the second base holds the liquid containing a metal component according to the metal pattern to be formed on the first base.

9. The metal pattern forming method according to claim 2,
    wherein a state of the liquid containing a metal component, which is held by the second base, is adjusted by heating the liquid or irradiating the liquid with light, before the first base and the second base are brought into contact with each other.

10. The metal pattern forming method according to claim 9,
    wherein the adjustment of the liquid containing a metal component includes one or more of viscosity adjustment, surface tension adjustment, and concentration adjustment.

11. The metal pattern forming method according to claim 1,
    wherein a contact angle of the liquid containing a metal component with respect to the lyophilic portion of the first base is 15° or less, and
    a contact angle of the liquid containing a metal component with respect to the liquid-repellent portion of the first base is 70° or greater.

12. The metal pattern forming method according to claim 1,
wherein a difference between a contact angle of the liquid containing a metal component with respect to the lyophilic portion of the first base and a contact angle of the liquid containing a metal component with respect to the liquid-repellent portion of the first base is 70° or greater.

13. The metal pattern forming method according to claim 1,
wherein a surface tension of the liquid containing a metal component at 25° C. is 22 to 35 dyn/cm.

14. The metal pattern forming method according to claim 1,
wherein the first base has a higher temperature than the second base, and the first base and the second base are brought into contact with each other.

15. The metal pattern forming method according to claim 1,
wherein the liquid containing a metal component is an aqueous solution of metal particles or a metal compound, or a dispersion liquid obtained by dispersing metal particles or a metal compound in water.

16. The metal pattern forming method according to claim 1,
wherein the second base holds the liquid containing a metal component according to the metal pattern to be formed on the first base.

17. The metal pattern forming method according to claim 1,
wherein a state of the liquid containing a metal component, which is held by the second base, is adjusted by heating the liquid or irradiating the liquid with light, before the first base and the second base are brought into contact with each other.

18. The metal pattern forming method according to claim 17,
wherein the adjustment of the liquid containing a metal component includes one or more of viscosity adjustment, surface tension adjustment, and concentration adjustment.

* * * * *